United States Patent [19]

Huggins

[11] 4,092,619
[45] May 30, 1978

[54] MOS VOLTAGE CONTROLLED LOWPASS FILTER

[75] Inventor: John M. Huggins, San Jose, Calif.

[73] Assignee: Intel Corporation, Santa Clara, Calif.

[21] Appl. No.: 754,120

[22] Filed: Dec. 27, 1976

[51] Int. Cl.² .................. H03H 7/10; H01L 29/78
[52] U.S. Cl. ................... 333/70 R; 357/23; 357/51
[58] Field of Search ............... 333/70 R; 357/23, 51

[56] References Cited

U.S. PATENT DOCUMENTS

| 3,022,472 | 2/1962 | Tanenbaum et al. | 357/51 |
| 3,296,462 | 1/1967 | Reddi | 357/23 |
| 3,754,171 | 8/1973 | Anzai | 357/51 |

FOREIGN PATENT DOCUMENTS 954,532  8/1964  United Kingdom .................. 333/70

OTHER PUBLICATIONS

MOSFET in Circuit Design, R. H. Crawford, McGraw Hill, N.Y., 1967, pp. 71-72.

Primary Examiner—Alfred E. Smith
Assistant Examiner—Harry Barlow
Attorney, Agent, or Firm—Blakely, Sokoloff, Taylor & Zafman

[57] ABSTRACT

An MOS field-effect device which may be fabricated as part of an integrated circuit having the general characteristics of a lowpass filter. A source and drain region define a long channel (e.g. 500 microns or longer). The cutoff frequency of this lowpass filter which is in the audio range, is controllable by the potential applied to a gate member insulated from the channel.

12 Claims, 5 Drawing Figures

MOS VOLTAGE CONTROLLED LOWPASS FILTER

BACKGROUND OF THE INVENTION

1. Field of the Invention

The invention relates to the field of voltage controlled lowpass filters, particularly those employing MOS devices.

2. Prior Art

Numerous active and passive lowpass filters are very well-known in the art. Perhaps one of the most commonly used active filters in the audio range, employs an integrated circuit amplifier such as an operational amplifier with external feedback. This filter is very versatile and has excellent filtering characteristics, however, in many applications it is too large and too expensive, particularly since external components are required. In some applications there is a need for a lowpass filter which may be readily fabricated as part of an integrated circuit without external components. Often the more precise filtering characteristics which may be obtained with an active filter employing an operational amplifier are not required.

Frequency considerations in metal-oxide-semiconductor (MOS) devices for the most part have been confined to increasing the cutoff frequency or maximum operating frequency of field-effect transistors. To this end, higher mobility substrate materials have been employed. Self-aligned gate structures have permitted reduction in parasitic gate-to-drain and gate-to-source capacitance further increasing frequency performance. In some cases, smaller channel lengths are employed to obtain higher transconductance and lower active channel capacitance. The frequency characteristics of MOS devices are considered only as a limitation on performance, thus the focus of attention has been on increasing the cutoff frequency or maximum operating frequency.

In this application, an MOS device is described which has the general characteristics of a voltage controlled lowpass filter in the audio range. The MOS device may be readily fabricated as part of an integrated circuit with well-known MOS fabrication techniques.

SUMMARY OF THE INVENTION

An MOS field-effect device fabricated on a substrate which has the general characteristics of a lowpass filter including a cutoff frequency is described. An elongated gate member which is approximately 500 microns in length, or larger, is formed on the substrate and insulated from the substrate. A pair of spaced-apart regions formed in the substrate are disposed at opposite ends of this gate member and define a channel in the substrate beneath this gate member. One of these regions is coupled to receive the input signal to the device. Voltage means are coupled to the gate member for controlling the cutoff frequency of the device. The device acts as a lowpass filter with a cutoff frequency controllable by the voltage means.

DETAILED DESCRIPTION OF THE INVENTION

An MOS field-effect device having the general characteristics of a lowpass filter is described. The cutoff frequency of the device which may be in the audio range is electrically controllable. The device, as will be seen, may be fabricated employing known MOS technology.

Figure 1:
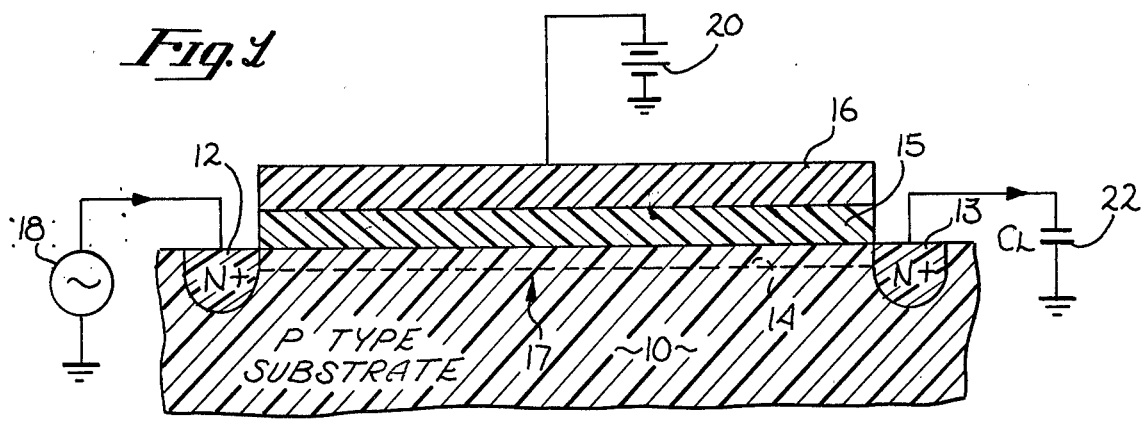
FIG. 1 is a cross-sectional elevation view of the MOS device of the present invention.
Figure 2:
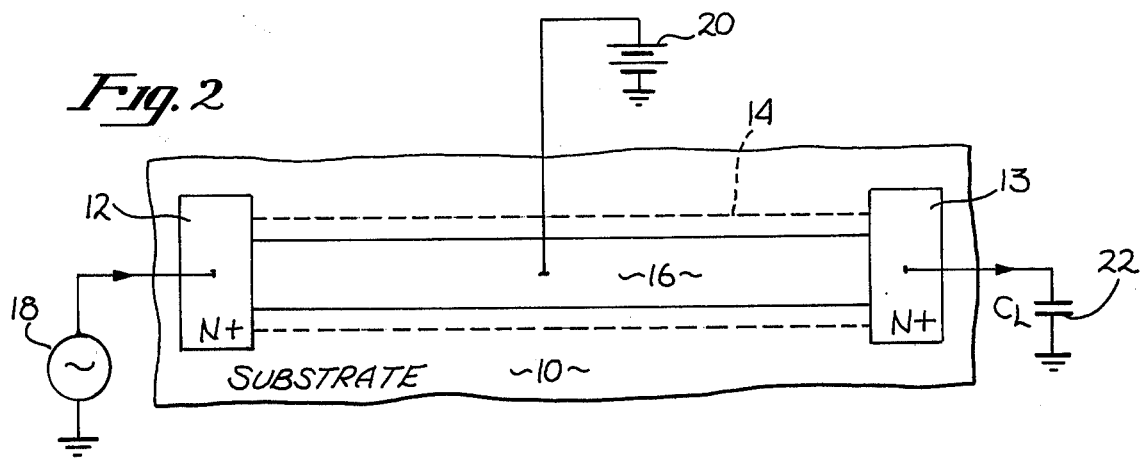
FIG. 2 is a plan view of the device of FIG. 1.

Referring to FIGS. 1 and 2, in the presently preferred embodiment, the filtering device is fabricated on a p-type silicon substrate 10. The device includes a pair of spaced-apart n-type regions shown as a drain region 12 and a source region 13. An elongated channel 17 is defined in the substrate between the regions 12 and 13.

An elongated polycrystalline silicon gate member 16 is disposed above, and insulated from, the substrate 10. This gate member extends from the drain region 12 to the source region 13. The source and drain regions 12 and 13 are fabricated in alignment with the gate member 16.

In the presently preferred embodiment, the channel 17 is ion implanted as shown by region 14. This implantation is used to adjust the threshold voltage of the device. The threshold voltage for the described n-channel device is negative (depletion mode device), that is, conduction occurs between the source and drain regions even when the gate and substrate are at the same potential. In the presently preferred embodiment, the threshold voltage of the device is approximately −3.0 volts.

The device is employed as a filter by applying an input signal to the drain region 12. In FIGS. 1 and 2, signal source 18 couples an AC signal to this terminal. The output of the device, that is, the filtered output is sensed at region 13. This region is shown coupled to a load capacitor 22.

The cutoff frequency of the device is controlled by the potential applied to the gate member 16. Thus, voltage means are provided for controlling or defining the cutoff frequency of the device. In FIGS. 1 and 2, a constant positive potential from a battery 20 is shown coupled to the gate member 16. This provides a fixed cutoff frequency.

Figure 3:
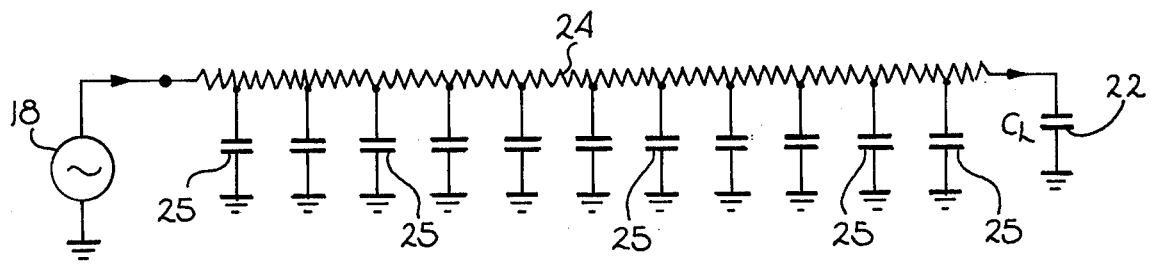
FIG. 3 is an equivalent circuit of the device of FIGS. 1 and 2.

Referring to the equivalent circuit of FIG. 3, the channel 17 (of FIGS. 1 and 2) may be represented by a resistor 24. The channel-to-substrate capacitance and the gate-to-channel capacitance is shown in FIG. 3 as the distributed capacitance 25.

Assume first that the capacitance associated with the load is substantially less than the distributed capacitance 25 of FIG. 3. In practice the gate member 16 is 500 microns long, or longer, and is separated from the substrate by an oxide layer 15 of approximately 1,000A. Where the output of the device of FIGS. 1 and 2 is coupled to another MOS device, such as the gate of the field-effect transistor, the capacitance of the load will be substantially less than the distributed capacitance 25. For this relationship of capacitances the distributed RC network of FIG. 3 is applicable. A mathematical approximation of this network indicates that the cutoff frequency (3 db point) is proportional to the gate voltage in excess of the device threshold voltage, and inversely proportional to the square of the channel length or gate length assuming negligible overlap between the gate and, source and drain regions. For a first order approximation, the cutoff frequency is independent of the channel width. However, this approximation assumes that the width of the gate is approximately eight microns or wider since otherwise field fringing effects must be considered. The cutoff frequency may be approximately represented by the following equation assuming a constant gate voltage in excess of threshold voltage and no load.

$$f_{co} \simeq \frac{1}{2\pi \, l^2 \, e_s (C_{sj} + C_{ox})}$$

where $l$ is the channel length, $e_s$ is the channel (sheet) resistivity, $C_{sj}$ is the source junction capacitance and $C_{ox}$ is the capacitance 25 of FIG. 3.

An example of an n-channel device with a cutoff frequency in the audio range includes a gate member of approximately 6,000 microns in length and approximately 8 microns in width. A threshold voltage of approximately −3.0 volts is employed; this threshold voltage is obtained on a p-type substrate with an ion implanted channel. Assuming that the gate is biased at +12 volts and the substrate is biased at −5.0 volts, a cutoff frequency of approximately 5Khz results. It is not necessary to have this large voltage difference (17 volts) between the gate member and substrate, however, this large voltage difference permits signals of large amplitudes to be filtered.

In another example, a cutoff frequency of approximately 48 Khz may be obtained with a gate length of 500 microns where the potential applied to the gate member is 4 volts in excess of the threshold voltage of the device without substrate biasing, or a cutoff frequency of 24Khz may be obtained with a gate length of 1000 microns where the gate member receives a 2 volt signal. However, the amplitude of the signal which may be filtered by these devices is substantially less than the previous example.

The roll-off characteristics beyond the cutoff frequency of the filtering device described above become steeper with higher frequencies because of the distributed parameters shown in the equivalent circuit of FIG. 3. Moreover, with these distributed parameters, more phase shifting occurs than with a lumped parameter circuit.

Figures 4, 5:
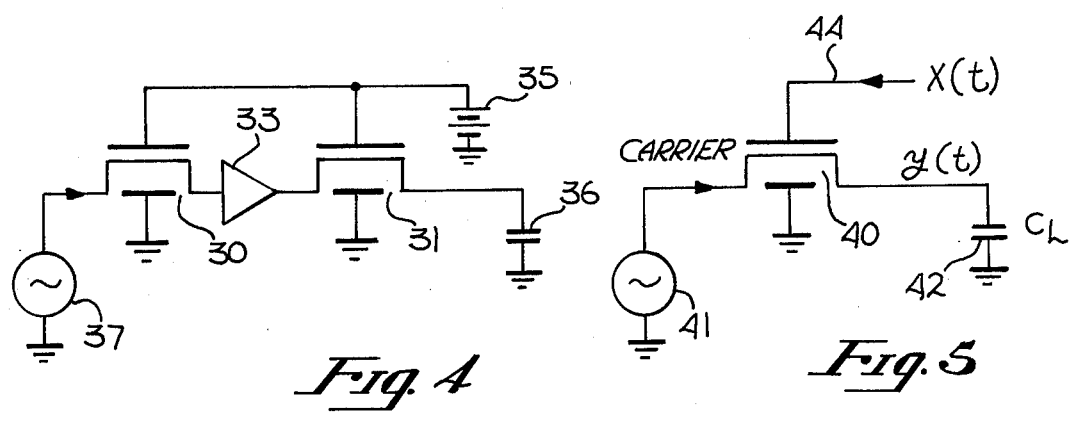
FIG. 4 illustrates a plurality of the MOS filtering devices of the present invention coupled in series; and, FIG. 5 illustrates the device of the present invention employed for amplitude modulating a carrier signal.

A plurality of the filtering devices of FIGS. 1 and 2 may be cascaded (coupled in series) as shown in FIG. 4. Devices 30 and 31 are coupled in series through a buffer 33 in FIG. 4. Each of the devices 30 and 31 may be identical to the device of FIGS. 1 and 2. The buffer 33, by way of example, may be an ordinary source follower stage. The input signal from the voltage source 37 is coupled to the drain terminal of the device 30. The output signal from the source terminal of device 31 is shown coupled to a capacitive load 36. The gate members of devices 30 and 31 are coupled to a positive potential 35. A steeper slope beyond the cutoff frequency is obtained by cascading a plurality of the filtering devices such as in FIG. 4.

The phase shift in the filtered signal associated with the device of FIGS. 1 and 2 may be minimized by increasing the capacitance of the load. Assume that the capacitance of capacitor 22 is substantially larger than the capacitance 25 shown in FIG. 3. With this load capacitance the device behaves more like a single pole, lowpass filter rather than an RC distributed network.

The cutoff frequency is proportional to the gate member voltage in excess of the threshold voltage and proportional to the channel width. The cutoff frequency is inversely proportional to the capacitance of the load ($C_L$) and inversely proportional to the first power of the channel length.

The device of FIGS. 1 and 2 may be employed where the cutoff frequency of the filter is varied by varying the gate member voltage. In FIG. 5 a device 40 which may be similar to the device of FIGS. 1 and 2 is shown with its drain region coupled to a signal source 40 which provides a sinusoidal carrier signal. The output of the device 40 is coupled to a load capacitor 42. For this embodiment the load capacitor 42 is substantially larger than the capacitance associated with the device 40. The gate member of device 40 is coupled to a line 44 which line receives a time varying signal $x(t)$. The output of this device $y(t)$ is a double sideband, amplitude modulated signal where $x(t)$ is the modulating signal.

The filtering device of FIGS. 1 and 2 may be employed in a plurality of other applications, such as waveform shaping in a clock comparator circuit, which circuit is frequently employed as part of an anolog-to-digital converter.

Thus, an MOS device has been described which may be employed as a lowpass filter. The device may be readily fabricated as part of an integrated circuit. Cutoff frequencies in the audio range are readily obtainable.

I claim:

1. An MOS field-effect device fabricated on a substrate of a first conductivity type for filtering an input signal, said device having the general characteristics of a lowpass filter with a controllable cutoff frequency, comprising:

an elongated gate member insulated from said substrate, said gate member having a length of approximately 500 microns, or longer;

a pair of spaced-apart regions in said substrate of a second conductivity type disposed at opposite ends of said gate member, said regions defining a channel in said substrate beneath said gate member, one of said regions coupled to receive said input signal; and, voltage supply means coupled to said gate member for defining said cutoff frequency of said device;

whereby said device acts as a lowpass filter between said regions with the cutoff frequency determined by said voltage supply means.

2. The device defined by claim 1 wherein said channel is ion implanted.

3. The device defined by claim 1 wherein said device conducts between said regions when said gate member and said substrate are at the same potential.

4. The device defined by claim 1 wherein said substrate is a p-type substrate and wherein said regions are n-type regions.

5. The device defined by claim 4 wherein said device conducts between said regions when said substrate and said regions are at the same potential.

6. The device defined by claim 5 wherein said voltage supply means is a source of a constant positive potential, relative to said substrate.

7. The device defined by claim 6 wherein the width of said gate member is approximately eight microns, or greater.

8. The device defined by claim 1 wherein said voltage supply means provides a time variable voltage to said gate member.

9. An MOS lowpass filter fabricated on a p-type silicon substrate, comprising:
- a pair of spaced-apart n-type regions disposed in said substrate, said regions defining a channel of approximately 500 microns in length, or longer;
- a gate member insulated from said substrate and extending between said regions over said channel;
- voltage means for controlling the cutoff frequency of said filter, coupled to said gate member;
- whereby an input signal applied to one of said regions is filtered, and whereby the cutoff frequency of said filter is controllable.

10. The MOS filter defined by claim 9 wherein said channel is ion implanted.

11. The MOS filter defined by claim 10 wherein said voltage means applies a constant positive potential, relative to said substrate, to said gate member.

12. The MOS filter defined by claim 9 wherein said filter conducts between said regions when said gate member and substrate are at the same potential.

* * * * *